United States Patent [19]
Brooks et al.

[11] Patent Number: 5,113,117
[45] Date of Patent: May 12, 1992

[54] MINIATURE ELECTRICAL AND MECHANICAL STRUCTURES USEFUL FOR CONSTRUCTING MINIATURE ROBOTS

[75] Inventors: Rodney A. Brooks, Lincoln; Lee S. Tavrow, Somerville; Anita M. Flynn, Arlington, all of Mass.

[73] Assignee: Massachusetts Institute of Technology, Cambridge, Mass.

[21] Appl. No.: 404,741

[22] Filed: Sep. 8, 1989

[51] Int. Cl.$^5$ .............................................. H01L 41/08
[52] U.S. Cl. .................................... 310/328; 310/309; 310/330; 310/332; 357/26; 357/80; 29/837; 29/838; 29/839; 361/400; 361/405
[58] Field of Search ............... 310/309, 328, 330, 332; 361/400, 405; 357/26, 80; 29/832, 837-839

[56] References Cited

U.S. PATENT DOCUMENTS

| | | | |
|---|---|---|---|
| 3,154,281 | 10/1964 | Frank | 29/832 |
| 3,585,416 | 6/1971 | Mellen | 357/26 |
| 4,368,525 | 1/1983 | Obata et al. | 367/165 |
| 4,535,534 | 8/1985 | Ohashi et al. | 29/832 |
| 4,609,845 | 9/1986 | Soni et al. | 310/357 |
| 4,613,925 | 9/1986 | Mohri et al. | 361/400 |
| 4,785,177 | 11/1988 | Besoche | 310/330 |
| 4,918,691 | 4/1990 | Chall | 361/405 |
| 4,953,061 | 8/1990 | Nitkiewicz | 361/400 |

FOREIGN PATENT DOCUMENTS

| | | | |
|---|---|---|---|
| 0116646 | 9/1981 | Japan | 29/837 |
| 0052835 | 3/1983 | Japan | 357/80 |
| 0232972 | 10/1987 | Japan | 357/26 |
| 0232375 | 9/1988 | Japan | 357/26 |

OTHER PUBLICATIONS

Flynn et al., "MIT Mobile Robots—What's Next?", IEEE Robotics and Information Conferences, Philadelphia, PA, Mar., 1988.
3D Systems, Inc. Engineering data Sheet, Sylmar, CA Mar., 1986.
Feely "Micro-Structures" IEEE Solid-State Sensor and Actuator Workshop, Hilton Head, SC Jun. 6-9, 1988.
Flynn "Gnat Robots (And How They Will Change Robotics)", IEEE Micro-Robots Teleoperators Workshop, Hyannis, MA, Nov., 1987.
Flynn, "Gnat Robots", AI Expert, Dec., 1987, pp. 34-42.
Beni et al., "Swarm' Intelligence in Cellular Robotic Systems:", NATA Workshop on Robotics in Biological Systems, Tuscany, Italy, Jun. 13, 1989.
Feely "The Role of the Latent Image in a New Dual Image, Aqueous Developable Thermally Stable Photoresist" Polymer Engineering & Science 26:16, Sep. 1986.
Brooks et al., "Fast, Cheap and Out of Control: A Robot Invasion of the Solar System", MIT AI Memo, Jun. 15, 1989.
DeWeerth and Mead "A Two-Dimensional Visual Tracking Array", Proceedings of the MIT Conference on VLSI, May 1988, available from the MIT Press.
McCharles and Hodges "Charge Circuits for Analog LSI", IEEE Transactions on Circuits and Systems, vol. CAS-25, Jul. 1988, pp 490-497.
Feely "Microplastic Structures" Proc. SPIE Conf. on Advances in Resist Technology and Processing III, Santa Clara, CA, Mar. 1986.

(List continued on next page.)

*Primary Examiner*—Steven L. Stephan
*Assistant Examiner*—Thomas M. Dougherty
*Attorney, Agent, or Firm*—Fish & Richardson

[57] ABSTRACT

An electrical device comprises a three-dimensional body formed from an organic polymer and a plurality of electrical elements attached to the body. The body has a regular pattern of sockets in its surface, and the electrical elements have barbed appendages, or, alternatively, the body has appendages and the electrical elements have sockets. The elements are affixed to the body by insertion of the appendages into the sockets. Electrical connections between the electrical elements are formed by selective deposition of tungsten onto the surface of the body with a scanning laser beam. A miniature ("gnat") robot can be constructed using those constructional techniques.

16 Claims, 13 Drawing Sheets

OTHER PUBLICATIONS

Chin et al., "Wafer-Scale Laser Pantography: V", presented to the Third DoE Workshop on Computer Aided Engineering, Livermore, CA Oct. 13-14, 1983.

Budd et al., "Sol-Gel Processing of $PbTiO_3$, $PbZrO_3$, PZT, and PLZT Thin Films" British Ceramics Proceedings vol. 36, 1985, pp. 107-121.

Howe et al., "Electrostatic Micromotor" U.S. patent appl. 07/52,725, filed May 20, 1987, abandoned in favor of divisional U.S. patent appl. Ser. No. 07/342,952 filed Apr. 25, 1989 and continuing U.S. patent appl. Ser. No. 07/376,208, filed Jul. 3, 1989.

Belforte "Laser Modeling Reduces Engineering Time", Laser Focus World Jun. 1989, pp. 103-108.

Feely et al., "3-D Latent Image in an Acid Hardening Resin", SPSE Photo-Chemistry for Imaging Symposium, Jun. 26-29, 1988.

Harman et al., "Wafer-Scale Laser Pantography: 1-IV", presented to various conferences and societies, Nov. 1982 to Nov., 1983.

"Proceedings of SPIE" reprint, by W. Feely of Rohm & Haas Co., Mar. 10-11, and Nov. 1986.

"Micro Structure", IEEE, by W. Feely, 1988.

+cos(t) +sin(t) -cos(t) -sin(t) +cos(t) +sin(t) -cos(t) -sin(t)

MINIATURE ELECTRICAL AND MECHANICAL STRUCTURES USEFUL FOR CONSTRUCTING MINIATURE ROBOTS

BACKGROUND OF THE INVENTION

This invention relates to manufacturing of miniature electrical and mechanical structures, and particularly to manufacturing of miniature robots.

Known robots are designed to individually complete such tasks as window washing, automated manufacturing, or other physical duties which are too difficult, hazardous, or mundane for humans to perform. It has been found that the physical strength of robots can easily exceed that of human beings, but the programming of such robots to perform all but the most repetitive tasks has proven difficult.

Known robot designs are quite expensive, owing mostly to the expense of suitable mechanical actuators and the attendant power systems.

SUMMARY OF THE INVENTION

In a first aspect, the invention features attaching semiconductor dies to supportive structure using appendages (or sockets) integrally formed in the crystalline material of the semiconductor dies. In preferred embodiments, the appendages have one or more retaining barbs.

In a second aspect, the invention features providing a plurality of sockets (or appendages) in the supportive structure so that semiconductor dies can be attached at a plurality of locations on the surface of the supportive structure. In preferred embodiments, the supportive structure is a laser molded body of organic polymer (e.g., methyl-acrylate); the sockets (or appendages) on the supportive structure are arranged in a pattern that matches the pattern of the mating appendages (or sockets) on the semiconductor die.

In a third aspect, the invention features a plurality of semiconductor dies attached to an organic polymer supportive structure with electrical connections between the dies being made by conductive material deposited on the surface of the organic polymer structure. In preferred embodiments, the conductive material (e.g., tungsten) is deposited by laser pantography.

In a fourth aspect, the aforementioned features are applied to the construction of a robot. The invention makes possible the manufacture of a very small size, completely integrated, three-dimensional "gnat robot," having limbs and integrated electronic circuitry attached to all sides of its body. A three-dimensional body on the order of two or three millimeters in size is molded from an organic polymer. A number of electrical elements are attached to this body, and electrical connections are made between the elements.

Other advantages and features of the invention will be apparent from the following description of preferred embodiments and from the claims.

DESCRIPTION OF PREFERRED EMBODIMENTS

All of the figures are somewhat diagrammatic and are not drawn to scale.

Figure 1:
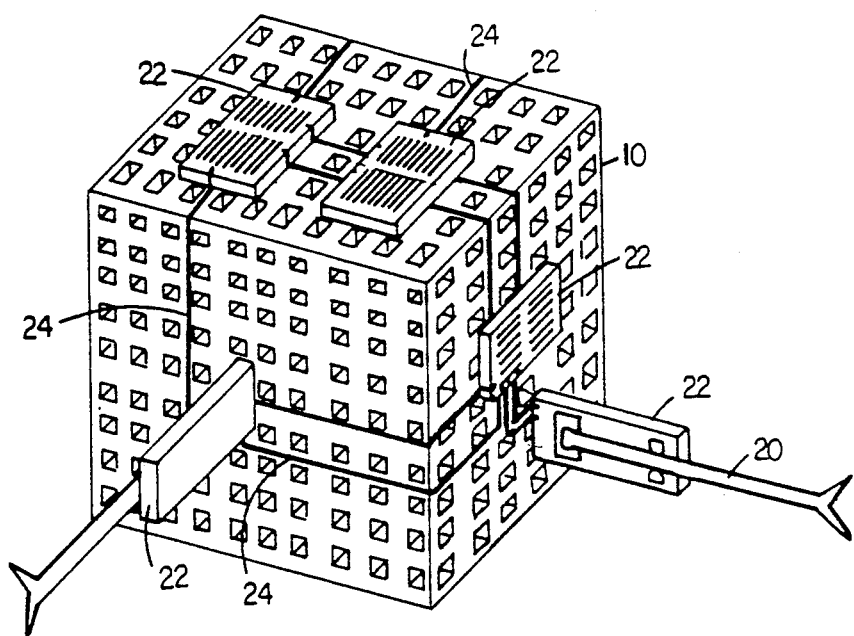
FIG. 1 is a perspective view of a gnat robot embodiment of the invention.

FIG. 1 shows a gnat robot in accordance with the invention. The robot is approximately cubic in shape, and about two or three millimeters in size. It has a plastic body 10 to which a number of limbs 20 are affixed. Limbs 20 may be used as legs for locomotion of the robot. At other times pairs of the limbs may operate in tandem as a manipulator or gripper.

Figure 3:
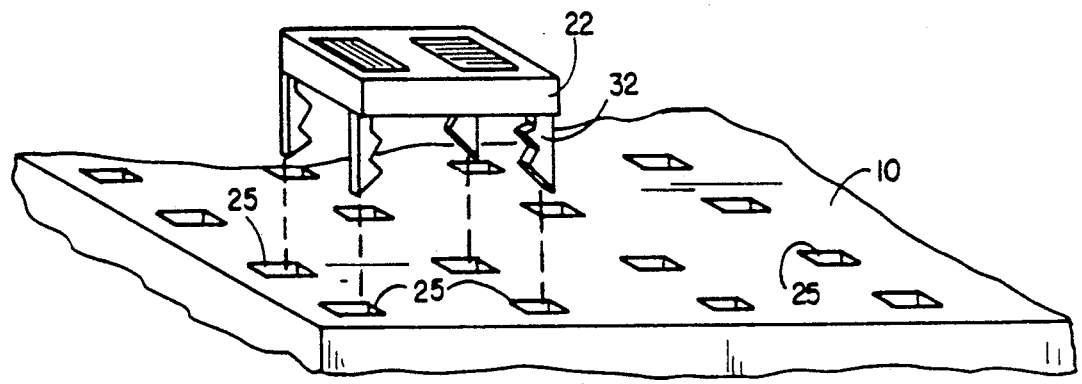
FIGS. 3 and 4 illustrate alternative techniques for placement of electrical elements onto a gnat robot body.

The structure of such a robot is hybrid. Individual silicon dies 22 are implanted into sockets in a laser sculpted plastic body 10. The dies are separately fabricated to contain control electronics, sensors, electronic motors, and actuators. The dies are mounted on the plastic body using microfabricated appendages and sockets, as illustrated in FIG. 3. Laser-deposited tungsten wires 24 connect the silicon dies together to form a complete gnat robot.

Such a robot may be mass-produced in analogous manner to the production of hybrid integrated circuits. Using mass production, gnat robots will be relatively inexpensive to build and thus in some applications may be disposable. However, owing to dense integration of computing power, each gnat robot can possess levels of intelligence similar to that found in much larger previous robots.

When properly programmed, a large number (or "swarm") of gnat robots can, in parallel, perform tasks currently assigned to single large robots, or other tasks not currently performed by robots. Gnat robot swarms can take advantage of their large numbers to accomplish highly distributed tasks, and, owing to their low cost, the gnat robots can be disposed of when the job is complete.

Swarms of gnat robots can perform tasks such as, for example, operating as distributed sensors. By gathering information via audio, visible light or infrared radiation, each robot can be used to locate distributed information. For example, each robot may be programmed to eject a dye when sensing underwater noise. A swarm of such robots floating on the surface of the ocean forms a submarine or whale detector. In another example, a swarm of robots may sample the soil of an unexplored planet. Corner laser reflectors on the robot bodies may be used to communicate information to a centralized location (possibly an orbiting satellite) via a scanning laser at the central location. In another example, gnat robots are equipped with micro-accelerometers and vibration sensors. A swarm of these robots can form a sophisticated distributed seismographic sensor.

Gnat Robot Manufacture

Figure 2:
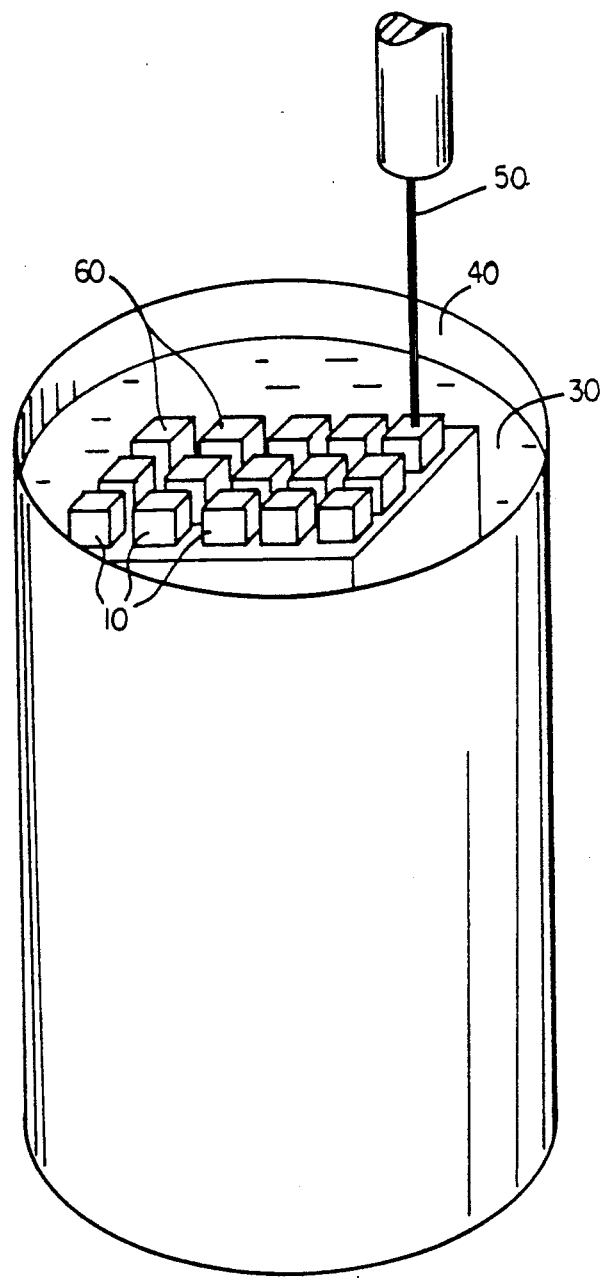
FIG. 2 illustrates free form laser molding of a gnat robot body.
Figure 5:
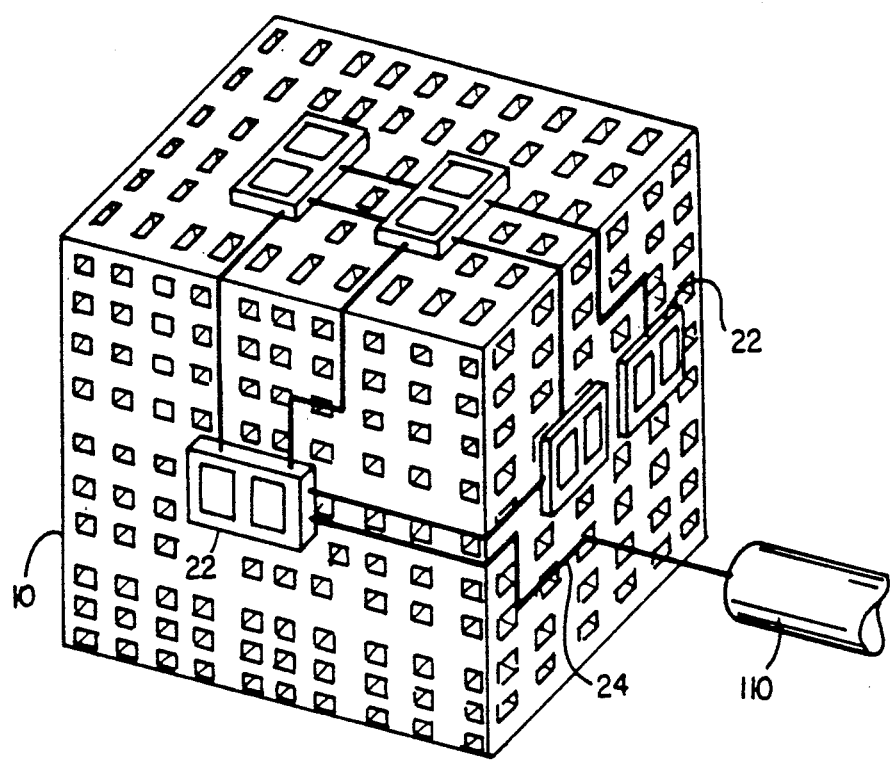
FIG. 5 illustrates the electrical connection of electrical elements through laser pantography.

The robot body 10 is produced using three-dimensional free-form laser molding as illustrated in FIG. 2. In this process, a platform 30 sits just beneath the surface of a liquid bath of polymer 40. A steerable, ultraviolet laser 50 is used to draw a pattern on top of platform 30. The polymer solidifies at every place exposed by the laser, creating a very thin solid structure 60 sitting on top of platform 30. Platform 30 is slowly lowered into the polymer bath 40 and new layers of solid polymer are drawn on top of the existing layers. Some of the layers are drawn so that sockets 25 (FIGS. 1 and 5) are left in the surface of the body. Eventually, a partially hollow, three-dimensional structure 10 is built. This structure is approximately cubical and about two or three millimeters in diameter.

The preferred polymer 40 for laser molding is methyl-acrylate. Methyl-acrylate is part of a broad range of organic photosensitive resists which are the cornerstone of the integrated circuit industry. The photoresist, polymethyl-methacrylate (PMMA) is often used for defining features down into the submicron and deep-submicron range (1.0–0.01 μm) in state of the art silicon processes. Thus, the granularity of the methyl-acrylate polymer will not limit the size or resolution of the proposed robots. The above photo polymers are also inexpensive and are non-toxic when polymerized.

Other embodiments of the invention may use lithographic methods for free form molding, such as those disclosed by Feely et al. in "3-D Latent Image in an Acid Hardening Resin", Proceedings of SPSE *Photochemistry for Imaging Symposium*, June 26–29, 1988, ISBN 0-89208-140-6.

Figure 4:
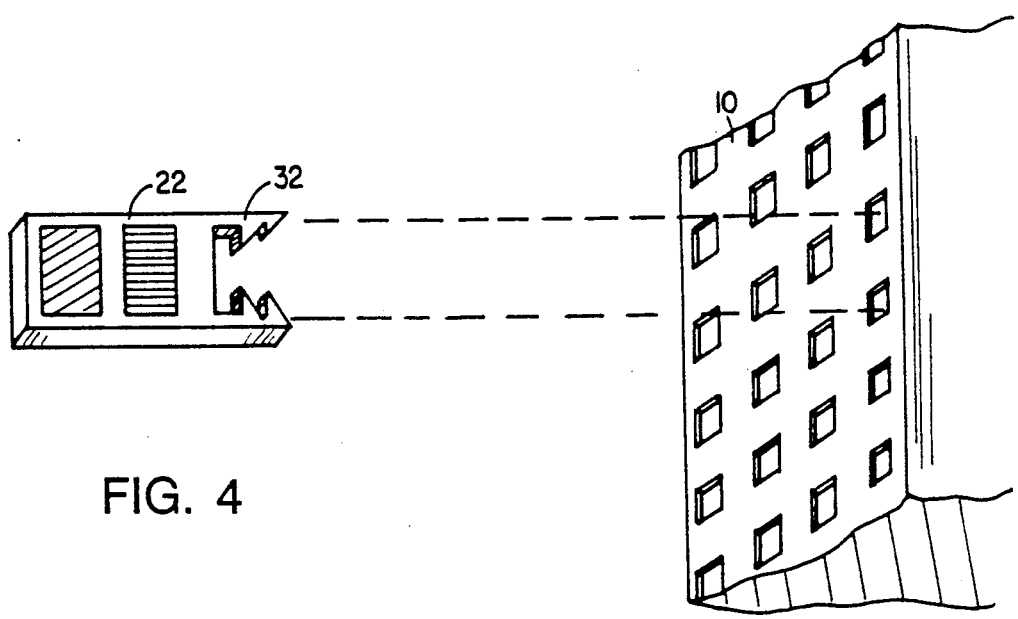

The surface of body 10 has many sockets 25 spaced such that the barbed appendages 32 of the electrical elements 22 will interlock with one set of sockets 25 in many possible positions on the robot surface (FIGS. 3, 4). In this embodiment, exact placement of the electrical elements is not required. However, programming of the robot must include a mechanism for calculating and accounting for variation of possible positions of the elements on the robot body.

Exact placement of the electrical elements can be performed by a recursive manufacturing process. The electrical elements 22 are manually attached to prototype gnat robot bodies using precision manipulators. The prototype robots are designed to perform attachment of electrical elements to further robots, thus limiting the use of precision manipulators to the initial manufacture of the prototypes.

The appendages and sockets are shown in more detail in FIGS. 3 and 4. The appendages and sockets are made either by bulk micro-machining the silicon die edges into barbed appendages 32 which will fit into sockets in the 3-dimensional body 10 or, conversely, by forming barbed appendages on the surface of the body 10 which snap into bulk micro-machined sockets in the dies.

A more expensive alternative technique for attaching silicon dies is to form the appendages 32 and sockets 25 so that exact placement is required. More complex, and thus more retentive, shapes can be used for the appendages and sockets. But this connection technique is more time consuming, and therefore more expensive, owing to the small scale and high precision which must be exercised throughout.

After silicon dies 22 are attached, appendages can be added to the electrical elements which contain motors (each appendage having been independently manufactured using free form laser molding techniques discussed above), or as illustrated in FIG. 15, appendages can be manufactured on the same silicon die as the motors in an integrated fashion.

Electrical elements 22 are electrically connected after insertion. This is accomplished by selectively depositing "wires" 24 of conductive material (e.g. tungsten) on the surface of the body 10 between the elements using laser pantography, as disclosed by Herman et al, in their series "Wafer-Scale Laser Pantography: I-V", Lawrence Livermore National Laboratory, UCRL-88314, UCRL-88537, UCRL-89399, UCRL-89350, UCRL-89639, available from NTIS. A laser 110 (FIG. 5) scans the desired wire path through an ambient vaporized metal gas, causing a chemical reaction. The reaction deposits conductive lines 24 on the body surface.

Locomotion for the gnat robot is provided by a piezoelectric thin film ultrasonic motor. This motor is fabricated on a single chip.

Figure 6A:
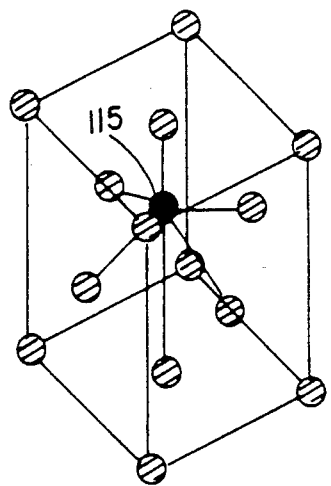
FIG. 6A and 6B illustrate the crystal structure of ferroelectric crystals.
Figure 6B:
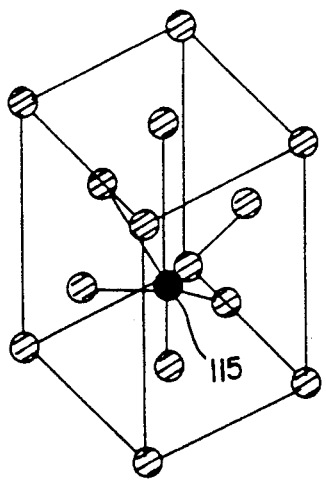

Lead zirconium titanate, otherwise known as PZT, is used for the piezoelectric thin film. Referring to FIGS. 6A and 6B, the crystal structure of PZT contains inherent asymmetries in its lattice (caused by the bistable location of Pb, Zr, and Ti ions). For illustrative purposes, two bistable states of the central Zr or Ti atom in the PZT lattice are depicted in FIG. 6A and FIG. 6B, respectively.

Figure 7:
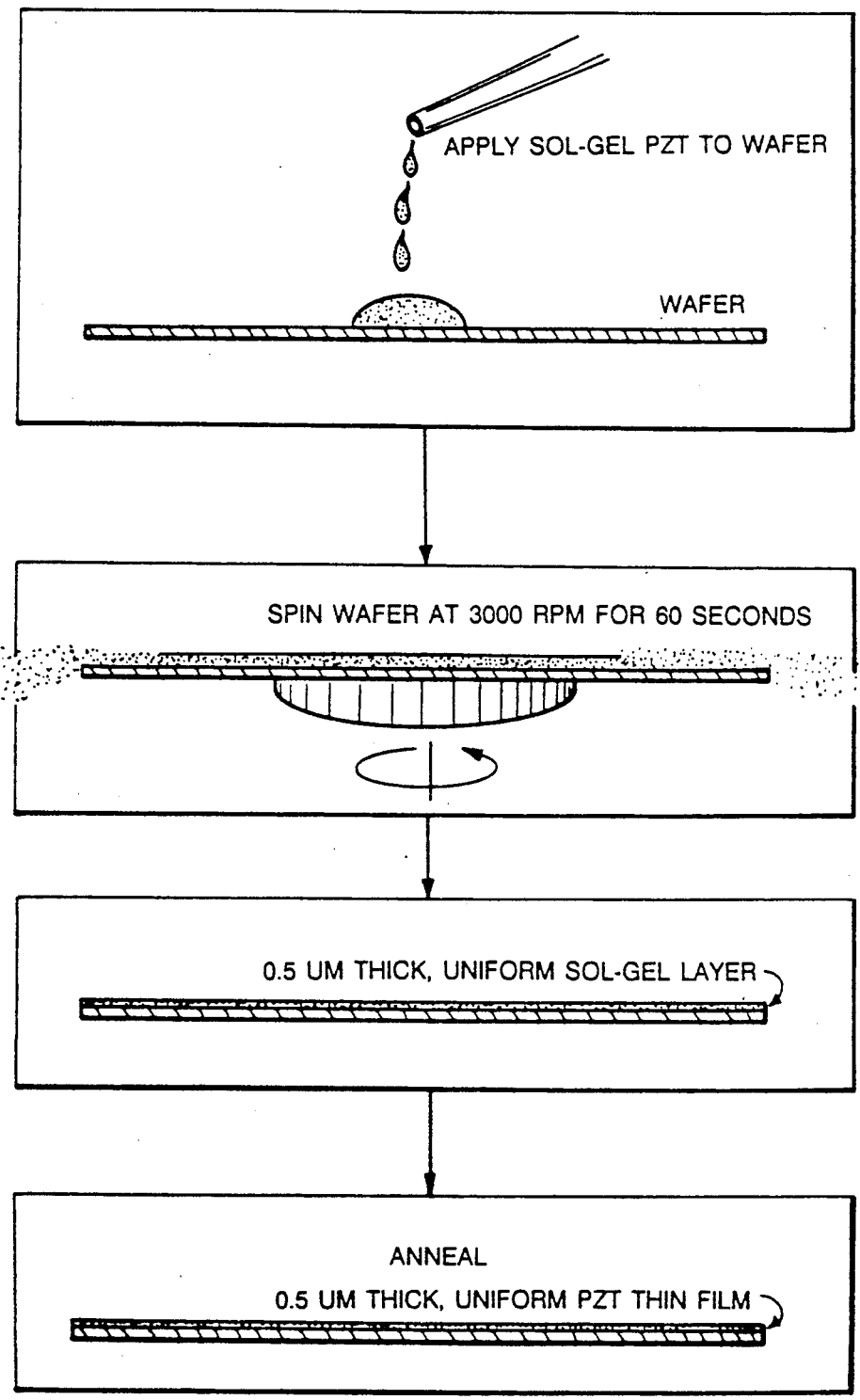
FIG. 7 depicts a PZT thin film process.

FIG. 7 illustrates a sol-gel process for creating crack-free thin films of PZT from 6000 angstroms to 1.2 microns thick. In this process a sol of PZT is spun onto a wafer to a desired thickness, and then annealed at high temperature to form the crystalline lattice. After the anneal, the material is poled to induce the desired piezoelectric properties. Further details on the processing of PZT thin films can be found in Budd et al. "Sol-Gel Processing of $PbTiO_3$, $PbZrO_3$, PZT, and PLZT Thin Films", British Ceramics Proceedings, Vol. 36:1985, pages 107–121, incorporated by reference herein.

Figure 8:
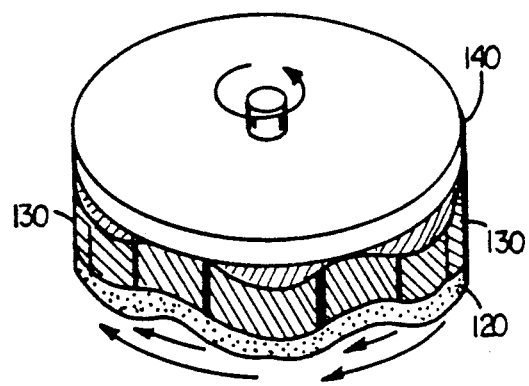
FIG. 8 is a perspective view of a rotary PZT deformation motor.

FIG. 8 shows the mechanism employed in a rotary embodiment of such a motor. A travelling wave of mechanical deformation is induced in a piezoelectric thin film 120 and then mechanically amplified through the use of attached elastic bodies 130, which also serve as the electrodes for exciting the PZT thin film. The thin film 120 and elastic bodies 130 effectively act as a stator. An inert rotary actuator 140 rests on top of the stator and is caused to rotate by a tangential frictional force at every point which is in contact with the stator. A load can easily be attached to this rotor as there is no need to levitate the rotary actuator (as in variable capacitance motors). Indeed, friction is actually necessary here to cause actuation.

In order to transduce electrical to mechanical energy, a ferroelectric material, such as PZT, must be "poled" (the process of permanently aligning the random polarized crystal orientations in the ceramic) through the application of a strong electric field. Once poled, a ferroelectric material will expand piezoelectrically when a voltage of one polarity is applied across it and contract when a voltage of the opposite polarity is applied.

FIGS. 9A through 9E show the bending moments due to this piezoelectric effect. A phased, spatially varying AC voltage (supplied, e.g., by AC voltage sources $V_1$, $V_2$, $V_3$, $V_4$, ground plane 145, and elastic bodies/contacts 160) is applied to a PZT thin film 120. By maintaining a fixed phase relationship between the AC excitation voltages, a travelling wave of elastic deformation is produced in the PZT this film 120. For example, in FIGS. 9A through 9E, positive applied voltage creates a contraction of the PZT film, and negative applied voltage creates an expansion of the PZT film.

Figure 9A:
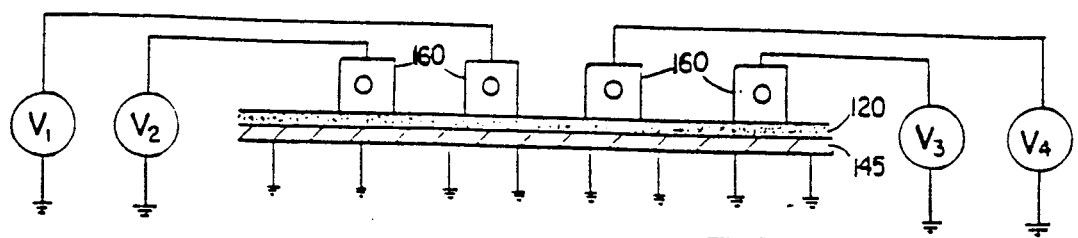
FIGS. 9A through 9E are diagrams of PZT deformation characteristics in a PZT deformation motor.

In FIG. 9A, the voltage sources are turned off, and thus the PZT film 120 is unstrained. In FIGS. 9B through 9E, the voltage sources are energized by phased, sinusoidal voltage waveforms, thus creating sinusoidal mechanical bending stresses in the PZT film. Each of FIGS. 9B through 9E is a "snapshot" of the bending strain in the film at a moment in time. The figures represent one full cycle in the oscillation of the PZT film in response to the excitation voltages.

Figure 9B:
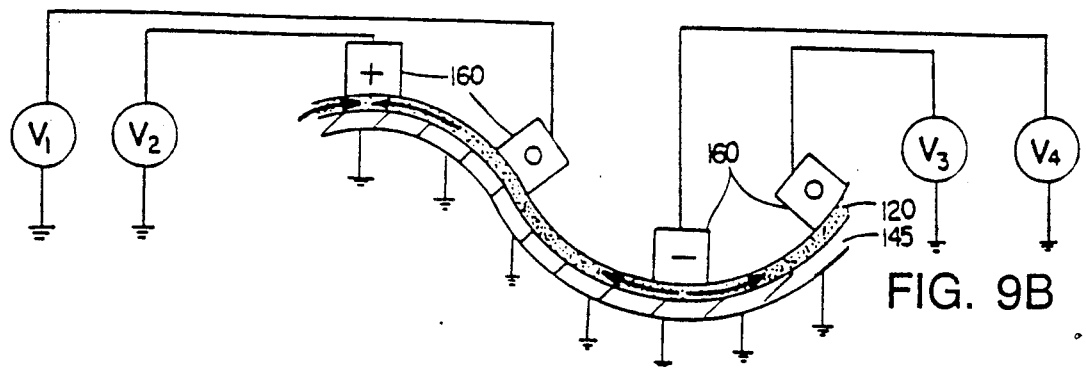

In FIG. 9B, $V_2$ is at the most positive value in its sinusoidal oscillation. $V_1$, which is delayed from $V_2$ by a quarter cycle, is at a zero value in its sinusoidal oscillation. $V_4$, which is delayed from $V_1$ by a quarter cycle, is at the most negative value in its sinusoidal oscillation, and $V_3$, which is again delayed by another quarter cycle, is at a zero value in its sinusoidal oscillation. The bending stresses in the PZT film contract the film at the contact at voltage $V_2$, and expand the film at the contact at voltage $V_4$, creating a sinusoidal deformation in the film as shown.

Figure 9C:
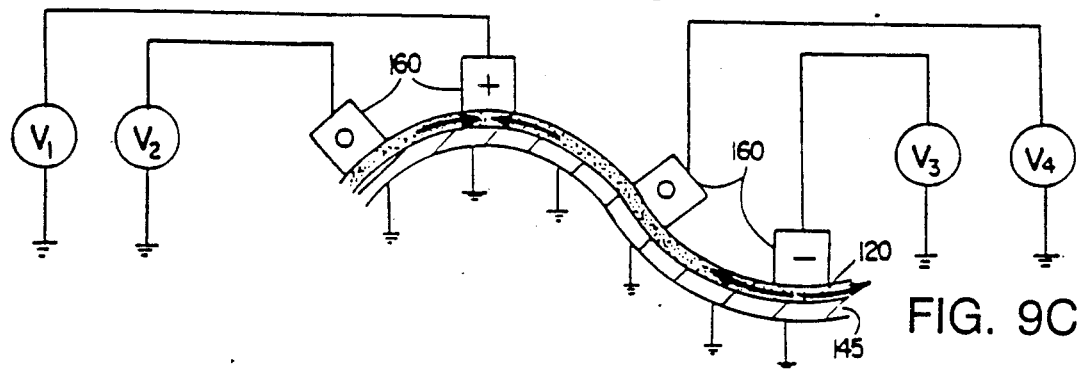

FIG. 9C depicts a moment one quarter cycle after FIG. 9B. $V_2$ has now reduced in value to 0 volts, $V_1$ has increased in value to the most positive value in the oscillation, $V_4$ has increased in value to 0 volts, and $V_3$ has decreased in value to the most negative value in the oscillation. The sinusoidal deformation of the film is now similar to that shown in FIG. 9B, but the points of maximum deformation have moved to the right, owing to the similar movements of the points of maximum voltage.

Figure 9D:
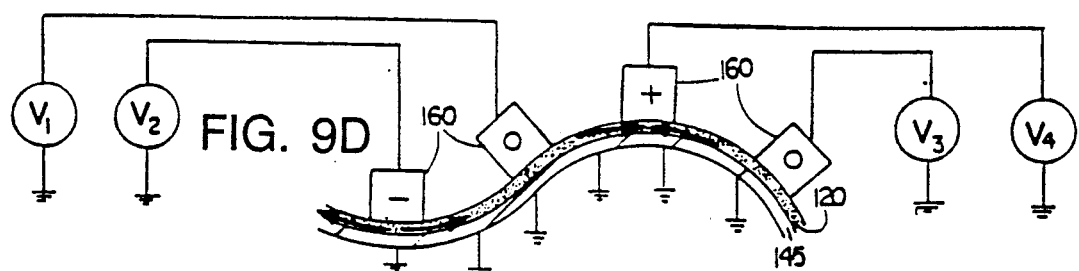

FIG. 9D shows the deformation of the film one quarter cycle later. The points of maximum deformation now appear at the contacts at voltages $V_2$ and $V_4$, but in opposite phase to the deformation shown in FIG. 9B.

Figure 9E:
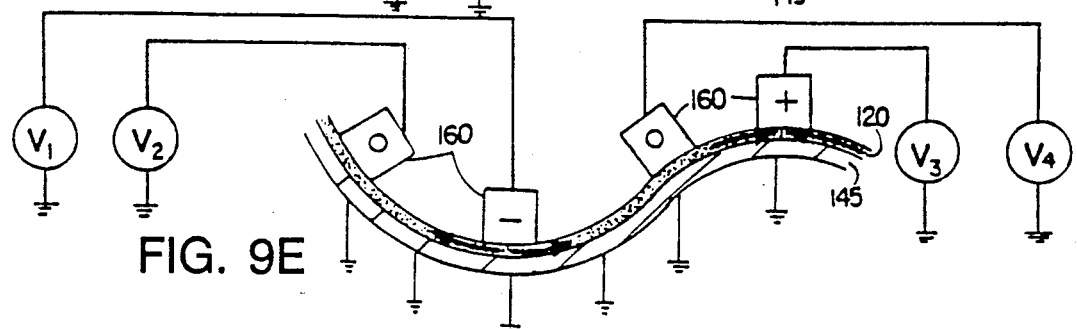
Figure 10A:
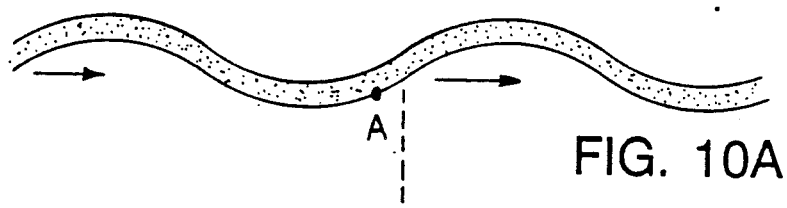
FIGS. 10A through 10F illustrate the ellipsoidal trajectory of a point on the thin film of a PZT motor.
Figure 10B:
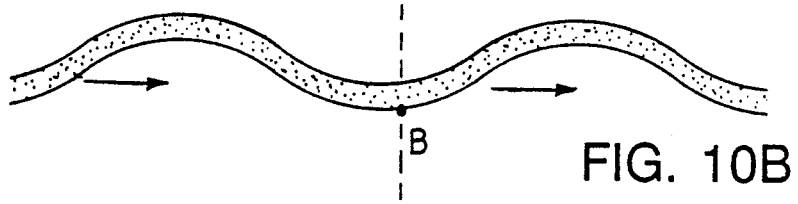
Figure 10C:
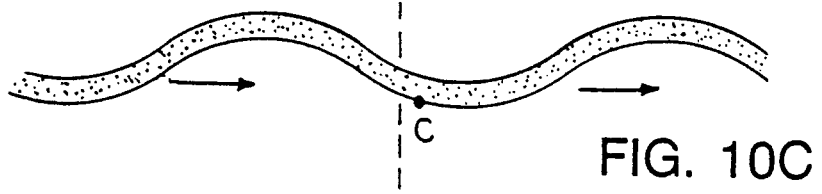
Figure 10D:
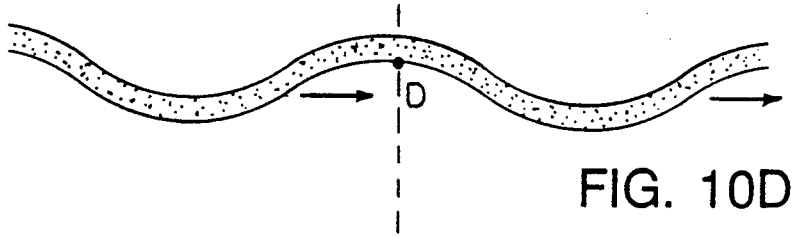
Figure 10E:
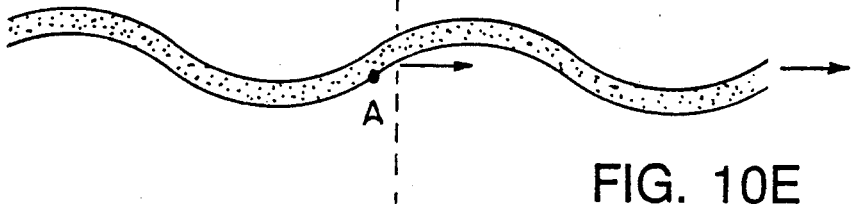
Figure 10F:
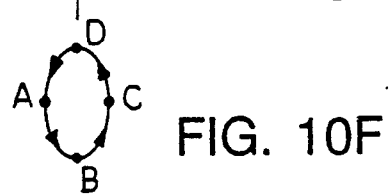

Finally, one quarter cycle later, as shown in FIG. 9E, the points of maximum deformation appear at the contacts at voltages $V_1$ and $V_3$, but in opposite phase to the deformation shown in FIG. 9C. One quarter cycle later, a full cycle has elapsed, and the deformation of the film will again be as shown in FIG. 9B.

It will be appreciated from the above illustration that the deformation pattern in the PZT film is a sinusoidal travelling wave, e.g. moving to the right in FIGS. 9B through 9E. The travelling wave is created by the discrete, phased voltages applied to the film, and its velocity is controlled by the frequency of the voltage sources and the spacing of the contacts. A greater variation of voltage phases provides more precise control of the film's deformation. Therefore, other embodiments of the invention may use more voltage phases to obtain more precise control. If less than four phases are used, the deformation of the film will become difficult to accurately control.

FIGS. 10A through 10F show a travelling wave of deformation induced by applying phased, alternating voltages to the PZT film 120. As this travelling wave moves through the PZT film and the attached elastic body (the movement is to the right in FIGS. 10A through 10E), every point in the film and body moves such that it traces out a counter-clockwise, elliptical trajectory over time. This motion is illustrated by the relative locations of points A, B, C and D, and is summarized in bottom of FIG. 10F.

The ellipse trajectory amounts to a coupling between the motion that comes about from expanding and contracting with the energy of the traveling wave moving to the right. When the travelling wave is moving to the right, the film and body move to the left at point D. If a rotary or linear actuator is placed on top of the elastic body, then it will contact the stator only when the frictional surface of the stator is in position D, and thus will move to the left.

An advantage to the ferroelectric motor is that friction is used as a feature. Gravity, or some normal force holding the actuator and stator in contact, is necessary in order to make use of the tangential force at each point D to generate continuous motion of the actuator.

Figure 11:
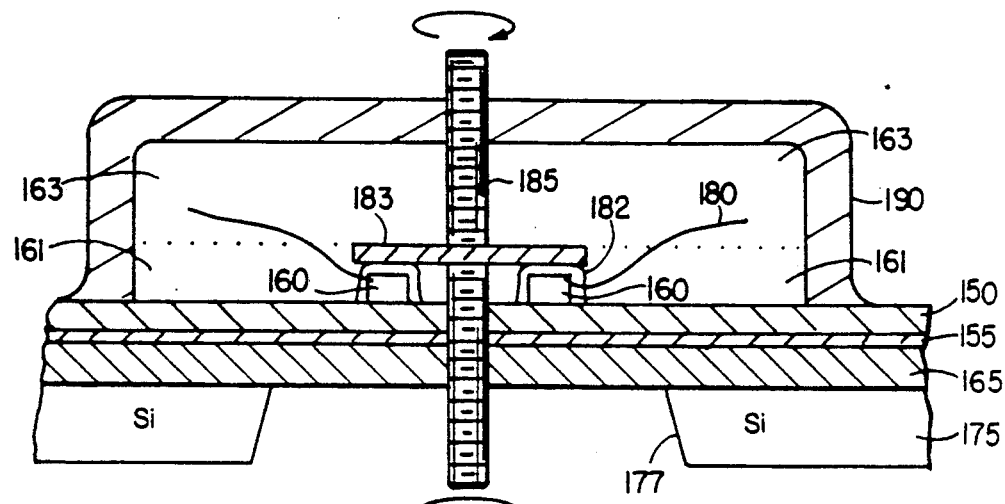
FIG. 11 is a cross-sectional view of a rotary PZT motor on a silicon substrate.

FIG. 11 shows a cross section of a rotary piezoelectric micromotor according to the invention. The motor is formed by laying down thin films of material onto a silicon substrate 175.

The first layer is an insulating mechanical membrane 165, which allows mechanical deformations, and isolates substrate 175 from the PZT excitation voltages. Membrane 165 is preferably of a nitride or silicon oxide grown onto the substrate. In the region underneath the micromotor, the silicon substrate 175 is etched away, leaving a cavity 177. This allows the area of membrane 165 under the motor to deform in response to excitation of the PZT.

The next layer in the motor structure is a ground plane 155 for providing a reference potential for the excitation sources, preferably of platinum metallization. Platinum is preferred because it provides a diffusion barrier to prevent the PZT from reacting with the silicon to form stable, low K lead silicates. Other metallizations, such as Aluminum, will not perform this function. In addition, the metallized ground plane aids in the adhesion of following layers.

Next, piezoelectric material such as PZT is spun onto the substrate, forming a micro-mechanical surface 150. Electrodes 160 are patterned out of gold or platinum on top of PZT surface 150 in a rotary configuration. (Aluminum may not be used for the contacts because it has a very stable oxide surface which makes contact to the PZT difficult.) Rotary actuator 183 with integral axle 185 rests on top of electrodes 160 and is actuated through a travelling wave of mechanical deformation of PZT surface 150, ground plane 155, and membrane 165. The electrodes 160 are connected to external sources, through bonding wires 180, or through suitably isolated metallization. As seen in FIG. 11, rotary actuator 183 and axle 185 rest frictionally atop the electrodes 160 and are supported by an integrated support structure 190 and/or a bearing hole 195 through the substrate. A wear layer 182, e.g. diamond or silicon nitride, is deposited between the electrodes and the rotary actuator to increase the life of the motor.

During fabrication, the rotary actuator 183 and support structure 190 are suspended by sacrificial oxide layers 161, 163. Once the rotary actuator and support structure are fabricated, a hole for the axle is created by a laser. In one embodiment, the hole is filled by polysilicon or similar material, forming axle 185. In other embodiments, the axle is prefabricated and manually inserted in the hole. The sacrificial oxide layers are then etched away, resulting in a free-floating rotary actuator and axle within the supports structure.

Other embodiments of a rotary motor may not fabricate an axle and support structure. Rather, a central bearing and capacitive rings would hold the rotary actuator in place, and the torque would be coupled out of the motor by microfabricated gears. The fabrication of the central bearing and capacitive rings would be as disclosed in U.S. patent application Ser. No. 07/52,725 filed on May 20, 1987 by Roger T. Howe et al for an "Electrostatic Micromotor", incorporated by reference herein.

Figure 12:
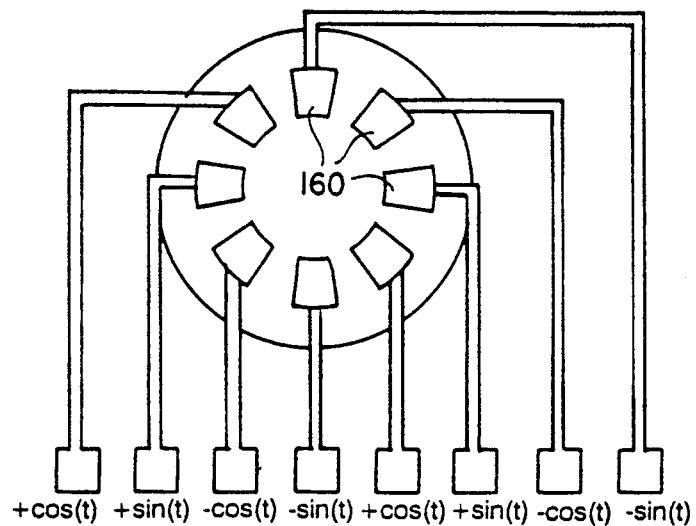
FIG. 12 is a top view of the terminals of a rotary PZT motor, showing the signals carried.

FIG. 12 shows the arrangement of electrodes 160 in the rotary motor. As can be seen, the electrodes are excited by sinusoidal voltages having fixed phase correlation.

Figure 13A:
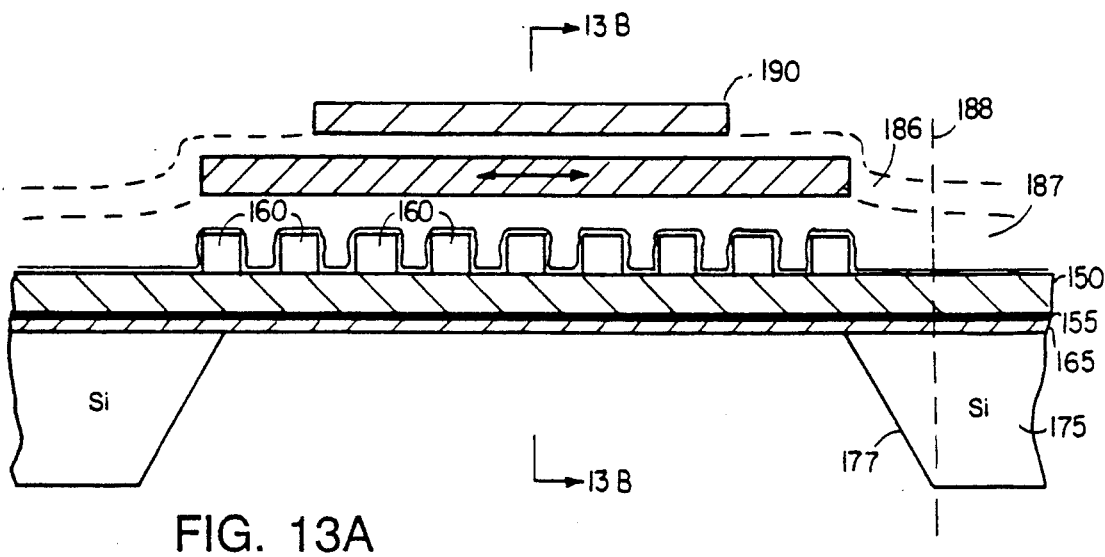
FIGS. 13A and 13B are cross-sectional views of a linear PZT motor.
Figure 13B:
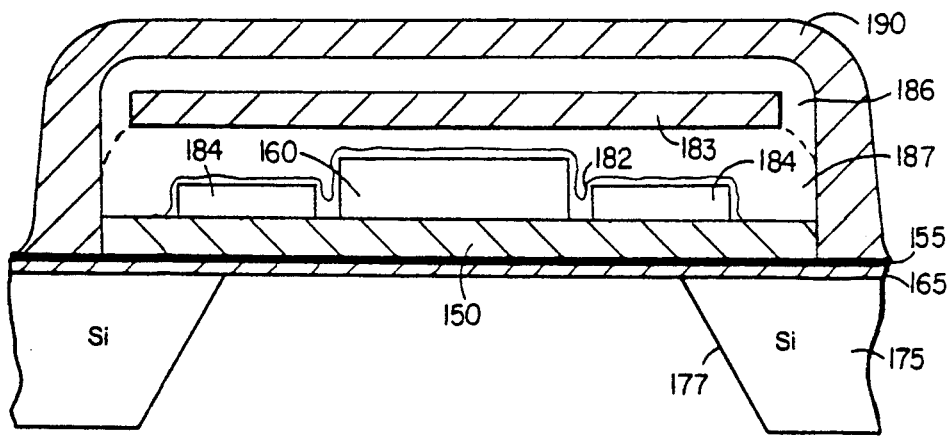
Figure 13C:
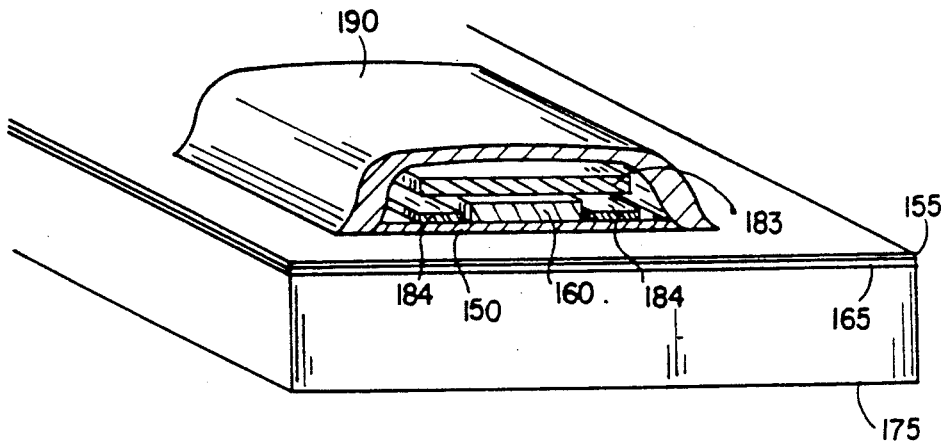
FIG. 13C is a perspective view of the linear PZT motor of FIGS. 13A and 13B.

FIGS. 13A and 13B show a linearly actuated piezoelectric micromotor according to the invention. The motor is shown in perspective view in FIG. 13C. The motor is formed in similar fashion to the rotary motor of FIG. 11, by laying down thin films of material onto a silicon substrate 175. The mechanical membrane 165, cavity 177, ground plane 155, and piezoelectric surface 150 are formed as set forth in conjunction with FIG. 11 above and perform the same functions as in FIG. 11.

Electrodes 160 are patterned out of gold or platinum on top of PZT surface 150 in a linear configuration, and are connected to external phased AC voltage sources. The linear actuator 183, preferably fabricated of polysilicon, rests on top of electrodes 160 and is actuated in the direction indicated by the arrow through a travelling wave of mechanical deformation of PZT surface 150, ground plane 155, and membrane 165.

Actuator 183 is held in place by a strap 190 extending transversely across the actuator midway along its length. During fabrication the linear actuator and strap are suspended by sacrificial oxide layers 186, 187. These layers are later etched away, resulting in a free-floating linear actuator within the strap.

As seen in FIG. 13B, additional electrodes 184 capacitively attract linear actuator 183 to the electrodes during operation. Electrodes 184 do not project as far above the substrate surface as electrodes 160, and thus do not touch linear actuator 183. By varying the bias voltage of capacitive electrodes 184, the friction between the linear actuator 183 and electrodes 160 can be optimally adjusted. When the power is off, the linear actuator is held in place by strap 190. To allow the linear actuator 183 to project beyond the substrate 175, all of the substrate beyond line 188 may be completely etched away.

Figure 14:
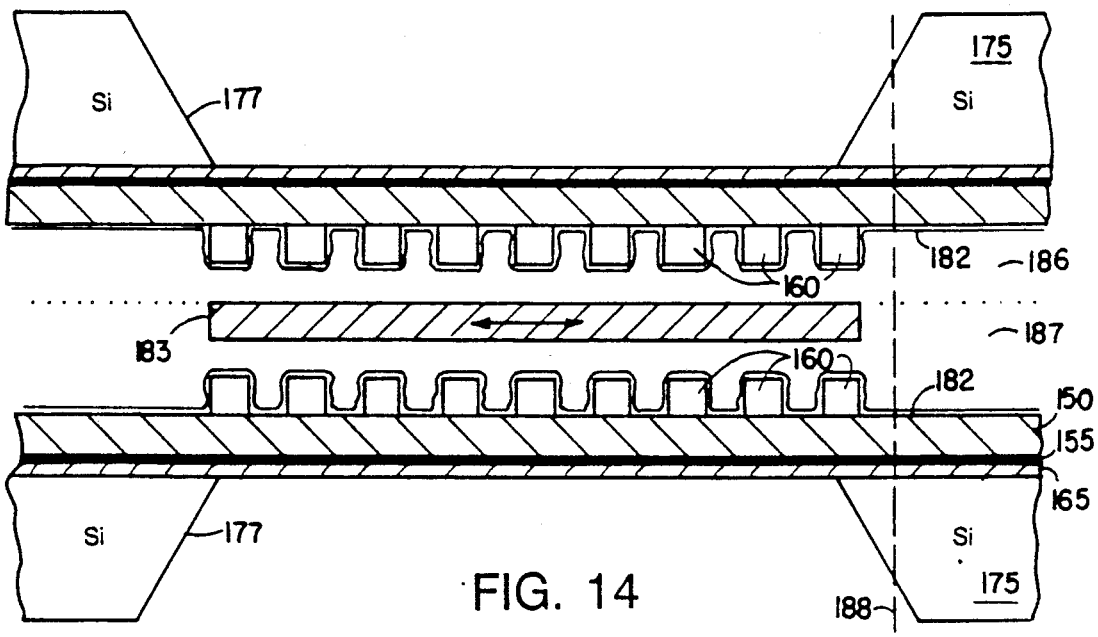
FIG. 14 is a cross-sectional view of an alternative embodiment of a linear PZT motor.

FIG. 14 shows an alternative embodiment of a linear motor structure. The strap 190 is eliminated by providing two sets of stators on two substrates, and bonding the substrates together using wafer-to-wafer bonding. The result is a "sandwich" structure with the linear actuator in the center. The wafer bonding is aligned using sacrificial oxide layers 186, 187, which are then etched from the sandwich, freeing the linear actuator 183 to slide across the electrodes 160. To allow the linear actuator 183 to project beyond the wafer sandwich, all of the sandwich structure beyond line 188 may be completely etched away.

Figure 15:
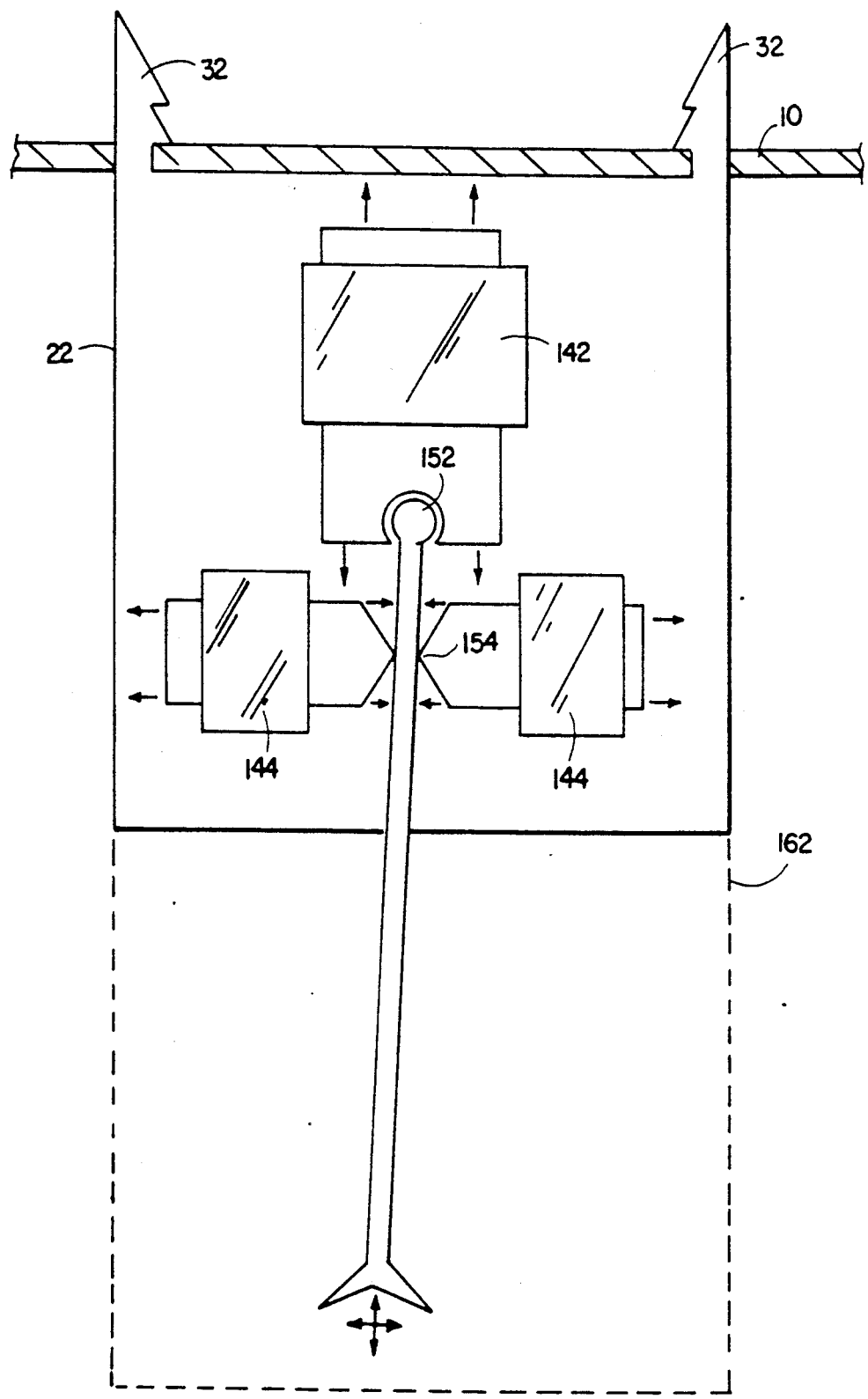
FIG. 15 is a top view of linear PZT motors coupled to an appendage.

FIG. 15 shows an integrated appendage/motor structure according to the invention. A electrical element 22 is fabricated with two linear PZT motors 142, 144, having motion in the vertical and horizontal direction. (The actuator in motor 144 has two straps is held to the element 22 by two straps.) An appendage 20 is also fabricated, along with bearings 152, 154 for controlling appendage position. During fabrication, appendage 20 is supported by a portion of the substrate 162 which is later etched away (preferably during the steps used to form cavities 177 of FIGS. 11-14). In this way, appendage 20 may be fabricated by conventional means, but may extend beyond the boundary of the surface of the resulting electrical element. Independent control of the two linear motors 142, 144 provides two-dimensional positioning of the appendage 20. Motor 142 translates the axis of rotation of appendage 20. Both motors are capable of rotating the appendage about the axis of rotation.

Robots and other electrical and electro-mechanical devices need sensors in order to interact with their environment. Infrared sensors have many advantages for image recognition. Some conventional infrared sensors use a cooled CCD. However, cooling conventional CCD infrared sensors is not practical in low power applications, such as gnat robots.

According to the invention, to avoid cooling, dielectric films are used as static, room temperature infrared sensors. The sensors are produced by a VLSI process, and are combined with conventional VLSI circuitry for sensing and processing the signals from the sensor sites.

To use dielectric material in conjunction with standard silicon processes, potential contamination and thermal problems are dealt with. The three major effects of impurities which can ruin MOS transistors are: high electron-hole recombination rates due to deep-level donor impurities, voltage threshold shifts due to mobile ion impurities in gate oxides, and large interface charges due to surface contamination. Some materials that cannot be present during MOS transistor fabrication are, for example, gold, copper, iron, and zinc, which are deep level donors, and sodium, potassium, and lithium, which are mobile ions in oxides. If present during deposition or thermal growth of thin films, these materials and others will also cause excessive interface charges and in extreme cases, fermilevel pinning (which will destroy MOS transistor action).

Many processing steps can be also be ruined by later steps that use high temperatures. For instance, it is desirable to dope the source and drain regions of small MOSFETs to only very shallow levels, but subsequent processing steps may require high temperatures which will inadvertently cause the doped junctions to diffuse to deeper levels. To prevent these junctions from diffusing inappropriately, the wafer cannot be exposed to temperatures above 800° C. for any length of time. In addition, high temperature cycling of wafers tends to both reduce mobilities and overstress wafers, affecting transistor yield and performance.

Unlike cross-contamination issues, thermal management problems do not prevent mechanical and device wafers from being processed in the same lab using the same equipment. This allows for sharing of resources which is very helpful in reducing expenses. Wafers containing films that could possibly contaminate the normal fabrication procedures can be protected or passivated with special layers. Finally, special layers can be applied on top of fabricated transistors and the wafers removed to a separate fabrication laboratory with a much reduced subset of equipment for final processing.

The sensing circuitry for the dielectric sensor makes use of switched analog circuit techniques, measuring the very small, heat-related capacitance changes of the dielectric film. The dielectric constant $\epsilon$ of the films, and thus the measured capacitance, is a strong function of temperature. To enhance the sensitivity of $\epsilon$ to temperature, the sensors may use a ferroelectric film which has a composition close to, but just above, its Curie temperature $T_c$ at ambient temperature. In ferroelectrics close to $T_c$, $\delta\epsilon/\delta T$ reaches very high values. In one embodiment of the invention, the ferroelectric material is PZT.

Accuracy is maintained by automatic calibration and noise cancellation. By measuring the actual capacitance of the dielectric film, as opposed to the currents produced from the sensors, a static infrared picture is generated by the sensors, eliminating the need for a chopper device.

Because the sensor sites can be manufactured directly over the sensor circuitry, the "fill factor" (i.e. the percentage of the chip area containing sensing sites) is improved over known CCD sensors. In silicon CCD sensors, part of the chip surface area must be devoted to silicon sensor sites, because the sensors are diffusion areas in the substrate. This means that a CCD sensor has a fill factor of much less than one, leading to below optimal sensor resolution.

The sensing requirements of a gnat robot may not be completely fulfilled by a infrared sensor. Therefore, the gnat robot is also provided with a visible light sensor, and simple algorithms, for example, optical flow algorithms, are used to control the robot to avoid objects.

Ideally, an infrared system would be coupled to a visible-light system, the strengths of one system being used to complement the other. If CMOS compatibility is essential, the visible light sensors may use photo, transistors, implemented by the parasitic bipolar capacitors which are formed naturally in a CMOS process. Examples of sensors of this type can be found in "A Two-Dimensional Visual Tracking Array" by Stephen P. DeWeerth and Carver A. Mead, Proceedings MIT Conference on VLSI, 1988, available from the MIT Press and incorporated by reference herein in its entirety.

In preferred embodiments, the visible light sensor sites take up approximately half of the chip area, and the processing circuitry transistors for both the visible and infra-red sensors take up the other half. A thin dielectric film is then deposited directly over the processing circuitry transistors, thus utilizing the second half of the chip for infra-red sensor sites. In these embodiments, the fill factor of the chip approaches 100%; 50% of the chip senses visible light and 50% senses infra-red. Note that, in these embodiments, no more silicon area is used than that required by a conventional visible-light sensor with no sensor sites over the transistors.

Figure 16:
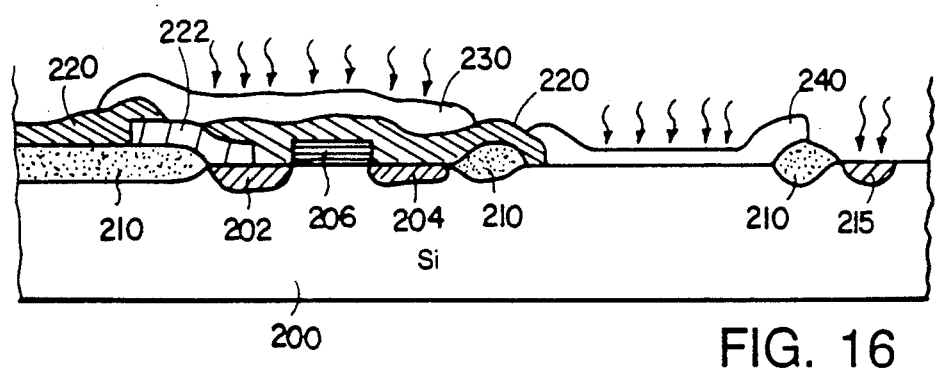
FIG. 16 is a cross-sectional view of a ferroelectric infrared sensor according to the invention.

FIG. 16 shows one embodiment of a combination infrared and optical sensor. The sensor is formed on a silicon substrate 200, in accordance with standard MOS processing. MOS transistor sources 202, drains 204, and gates 206 are grown and deposited on the substrate, along with field oxide 210. At the same time, diffusion area 215 is introduced, creating a CCD visible-light sensor. The MOS transistor 202, 204, 206 then insulated by a thermally insulating glass 220 (such as Aergel), which prevents the thermal behavior of the MOSFET from influencing the signal from the sensor 230 which overlays it. The MOSFET is connected to the sensor 230 by a small strip of metallization 222, which connects to the sensor 230 through a small opening in the insulator 220. The small size of the opening limits the thermal interaction of the MOSFET and the sensor 230. A reference sensor 240 is formed in direct contact with the substrate.

In operation, sensors 230, 240 and diffusion area 215 are exposed to light. The capacitance of the sensor 230 is compared to the reference capacitance of thermally grounded (i.e. in direct contact to the substrate) sensor 240, and the difference signal is processed by switched capacitor amplifiers.

Figure 17:
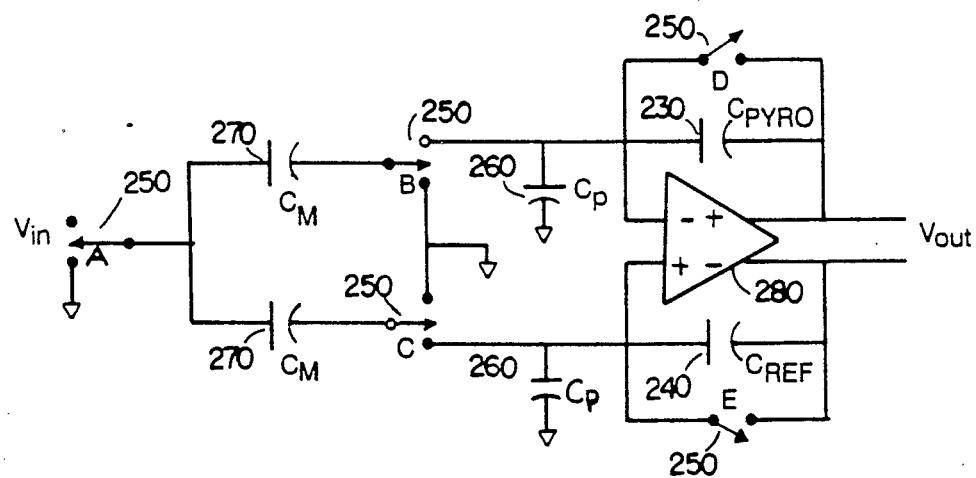
FIG. 17 is a circuit diagram of a switched capacitor circuit for amplifying the signal of the ferroelectric sensor of FIG. 16.

FIG. 17 shows a suitable switched capacitor amplifier circuit. The capacitances $C_{PYRO}$ 230 and $C_{REF}$ 240 are compared by an op-amp 280 (implemented by MOS transistors) and switched capacitors. The circuit comprises an input voltage source $V_{IN}$, switches 250, parasitic capacitances $C_P$ 260 (formed naturally from the substrate capacitances of the various diffusion regions tied to the '+' and '−' nodes of the op-amp), and matched input capacitors $C_M$ 270. The input capacitors $C_M$ and the parasitic capacitors $C_P$ are exactly matched to enhance the accuracy of the circuit, as discussed below.

To auto-zero the offset of op-amp 280, switches D and E are closed, and switches A, B, and C are grounded. This zeros the voltage on the input capacitors $C_M$ 270 and the signal capacitors $C_{PYRO}$ 230 and $C_{REF}$ 240, and also drives the offset voltage of op-amp 280 onto the parasitic capacitors $C_P$ 260.

After auto-zeroing the circuit, to compare $C_{PYRO}$ and $C_{REF}$, switches D and E are opened, switches B and C are connected to the '+' and '−' inputs of op-amp 280, and switch A is connected to the input voltage $V_{IN}$ (typically 1 to 5 volts). Input capacitors $C_M$ 270 then charge to a voltage near $V_{IN}$ by drawing charge off of parasitic capacitors $C_P$ 260 and signal capacitors $C_{PYRO}$ 230 and $C_{REF}$ 240. The majority of the charge drawn onto input capacitors $C_M$ is drawn off of capacitors $C_{PYRO}$ 230 and $C_{REF}$ 240 because they have capacitance values much larger than those of the parasitic capacitors $C_P$. In addition, because the capacitance values of the input capacitors $C_M$ and the parasitic capacitors $C_P$ are very closely matched, the charge drawn off of capacitors $C_{PYRO}$ and $C_{REF}$ will be substantially equal. If there are differences in the capacitance or $C_{PYRO}$ and $C_{REF}$ (caused by infrared radiation received by the sensor site), however, when equal amounts of charge are drawn of of $C_{PYRO}$ and $C_{REF}$, the resulting voltages on the two capacitors will not be equal. Therefore, the output voltage from op-amp 280 will be directly proportional to the difference in capacitance of $C_{PYRO}$ and $C_{REF}$, and will be indicative of the infrared radiation received by the associated sensor site.

The gain of the circuit is a function of the ratio of the capacitances $C_M$ and $C_{REF}$. This gain will ordinarily be less than one, and thus the output of the circuit will need to be followed by additional amplification stages. However, because the signals have low-level voltage swings (smaller than 1 volt), very accurate MOS op-amp designs may be implemented to amplify the difference signal. The accuracy of the circuit will also be affected by the matching of the channel "charge pumping" of the MOS switches 270 in use. This factor can be controlled by careful matching of the geometry of the switches.

Further discussion of the design and implementation of high-precision switched capacitor circuits can be found in "Charge Circuits for Analog LSI" by Robert H. McCharles and David A. Hodges, IEEE Transactions on Circuits and Systems, Vol. CAS-25, July 1978, pg. 490-497, incorporated by reference herein.

Other Embodiments

Other embodiments are within the scope of the following claims. For example, the body, motor and sensor and fabrication techniques described above may be used to produce other devices than gnat robots, such as integrated sensors and integrated circuitry packaging.

What is claimed is:

1. A semiconductor die for attachment to a supportive structure, comprising
    a base of crystalline semiconductor material,
    microcircuitry formed integrally within said base and comprising dopants in selected regions of said base and conductive material electrically connecting the doped regions,
    at least one appendage of crystalline semiconductor material integral to said base and extending outwardly therefrom,
    said appendage being sized for insertion into a socket formed in said supportive structure.

2. A semiconductor die configured to be attached to a supportive structure, comprising
    a base of crystalline semiconductor material,
    microcircuitry formed integrally within said base and comprising dopants in selected regions of said base and conductive material electrically connecting the doped regions,
    at least one opening in said base of crystalline semiconductor material,
    said opening forming a socket for receiving an appendage mounted on said supportive structure.

3. The semiconductor die of claim 1 or 2 wherein said appendage has one or more retaining barbs and said barbs and socket are sized so that said appendages are retained in said socket.

4. The device of claim 1 further comprising structure forming a robot, said structure comprising
    a plurality of said semiconductor dies, each attached to said supportive structure by said appendages and sockets,
    at least one actuator device formed on one said semiconductor die, and
    an appendage connected to said actuator device so that it may be moved relative to said supportive structure.

5. An electronic device, said device comprising
    a supportive structure having a plurality of sockets arranged across at least one surface of said structure, and
    at least one semiconductor die comprising
        a base of crystalline material,
        microcircuitry formed in said base,
        at least one appendage of crystalline material integral to said base and extending outwardly therefrom,
    said appendage and sockets being sized and shaped so that said appendage may be inserted into each of said sockets and retained there, thereby permitting said die to be attached to said structure at a plurality of locations on said surface of said supportive structure.

6. An electronic device, said device comprising
    a supportive structure having a plurality of appendages arranged across at least one surface of said structure, and
    at least one semiconductor die comprising
        a base of crystalline material,
        microcircuitry formed in said base,
        at least one socket formed in said base of crystalline material,
    said appendage and sockets being sized and shaped so that each of said appendages may be inserted into said socket and retained there, thereby permitting said die to be attached to said structure at a plurality of locations on said surface of said supportive structure.

7. The device of claim 5 wherein said supportive structure comprises a laser molded body of organic polymer.

8. The device of claim 6 wherein said organic polymer is methyl-acrylate.

9. The device of claim 5 wherein there are a plurality of appendages integrally formed in said die and said appendages form a pattern, and wherein said sockets on said supportive structure are arranged in a pattern matching the pattern of said appendages at a plurality of locations.

10. The device of claim 4, wherein said supportive structure has a plurality of sockets arranged across a second surface of said structure, thereby permitting said die to be attached to said second surface of said structure at a plurality of locations.

11. The device of claim 6 wherein there are a plurality of sockets formed in said die and said sockets form a pattern, and wherein said appendages on said supportive structure are arranged in a pattern matching the pattern of said sockets at a plurality of locations.

12. The device of claim 6, wherein said supportive structure has a plurality of appendages arranged across a second surface of said structure, thereby permitting said die to be attached to said second surface of said structure at a plurality of locations.

13. A method of packaging electrical elements, comprising the steps of:
    forming a three-dimensional body from an organic polymer,
    attaching a plurality of electrical elements to surfaces of said body, and
    connecting said electrical elements by selective deposition of conductive material on the surface of said body.

14. The method of claim 13 wherein said attaching step comprises
    forming at least one socket in said body,
    forming barbed appendages in said electrical elements, said appendages being sized and shaped to fit into and be retained in said sockets, and
    inserting said barbed appendages into said sockets.

15. The method of claim 13 wherein said attaching step comprises
    forming at least one socket in each said electrical element,
    forming barbed appendages in said body, said appendages being sized and shaped to fit into and be retained in said sockets, and
    inserting said barbed appendages into said sockets.

16. A method of packaging electrical elements, comprising the steps of:
    forming a three-dimensional body,
    attaching a plurality of electrical elements to surfaces of said body, and
    connecting said electrical elements by selective deposition of conductive material on the surface of said body.

* * * * *

UNITED STATES PATENT AND TRADEMARK OFFICE
CERTIFICATE OF CORRECTION

PATENT NO. : 5,113,117
DATED : May 12, 1992
INVENTOR(S) : Rodney A. Brooks, Lee S. Tavrow and Anita M. Flynn It is certified that error appears in the above-identified patent and that said Letters Patent is hereby corrected as shown below:

Col. 5, line 12; "this" should be --thin--.

Col. 9, line 38; "photo," should be --photo--.

Col. 11, claim 4, line 42; insert --2, 5, 6, 10 or 12-- after "claim 1".

Col. 12, claim 7, line 14; insert --, 6, 10, or 12-- after "claim 5".

Col. 12, claim 8, line 17; insert --7-- and delete "6".

Col. 12, claim 10, line 24; "claim 4" should be --claim 5--.

Signed and Sealed this

Twenty-first Day of September, 1993

Attest:

BRUCE LEHMAN

Attesting Officer

Commissioner of Patents and Trademarks